United States Patent
Wang et al.

(10) Patent No.: US 9,847,351 B2
(45) Date of Patent: Dec. 19, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Lanxiang Wang, Singapore (SG); Hong Liao, Singapore (SG); Chao Jiang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/006,123

(22) Filed: Jan. 26, 2016

(65) Prior Publication Data
US 2017/0213854 A1 Jul. 27, 2017

(51) Int. Cl.
| | | |
|---|---|---|
| H01L 27/12 | (2006.01) | |
| H01L 29/66 | (2006.01) | |
| H01L 29/786 | (2006.01) | |
| H01L 29/423 | (2006.01) | |
| H01L 21/77 | (2017.01) | |

(52) U.S. Cl.
CPC .......... *H01L 27/1225* (2013.01); *H01L 21/77* (2013.01); *H01L 27/127* (2013.01); *H01L 27/1218* (2013.01); *H01L 29/42384* (2013.01); *H01L 29/66969* (2013.01); *H01L 29/78603* (2013.01); *H01L 2021/775* (2013.01)

(58) Field of Classification Search
CPC ............. H01L 27/1225; H01L 2021/77; H01L 27/1218; H01L 27/127; H01L 29/42384; H01L 29/66969; H01L 29/78603; H01L 2021/775
See application file for complete search history.

(56) References Cited

U.S. PATENT DOCUMENTS

| | | | | |
|---|---|---|---|---|
| 5,917,563 | A  * | 6/1999 | Matsushima | G02F 1/136213 257/E27.111 |
| 6,238,967 | B1* | 5/2001 | Shiho | H01L 27/10873 257/E21.653 |
| 6,462,723 | B1* | 10/2002 | Yamazaki | H04N 9/3173 257/365 |
| 2003/0173890 | A1* | 9/2003 | Yamazaki | G02F 1/167 313/498 |
| 2004/0263441 | A1* | 12/2004 | Tanaka | G09G 3/325 345/76 |
| 2009/0291549 | A1* | 11/2009 | Yamasaki | C23C 8/16 438/585 |
| 2013/0175595 | A1* | 7/2013 | Cheng | H01L 21/84 257/304 |
| 2015/0170906 | A1 | 6/2015 | Redepenning et al. | |
| 2015/0303001 | A1 | 10/2015 | Warren et al. | |

OTHER PUBLICATIONS

Ang et al (2015), Next generation field-effect transistors based on 2D black phosphorus crystal, Digital Signal Process.*

* cited by examiner

*Primary Examiner* — Fei Fei Yeung Lopez
(74) *Attorney, Agent, or Firm* — Winston Hsu (57) ABSTRACT

A method for fabricating semiconductor device is disclosed. The method includes the steps of: providing a substrate having a first region and a second region; forming a gate layer on the substrate; forming a first gate dielectric layer on the gate layer; forming a first channel layer on the first region and a second channel layer on the second region; and forming a first source/drain on the first channel layer and a second source/drain on the second channel layer.

20 Claims, 5 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of integrating phosphorene onto flexible substrate for forming nano-electronic device.

2. Description of the Prior Art

Ever evolving advances in thin-film materials and devices have fueled many of the developments in the field of flexible electronics. These advances have been complemented with the development of new integration processes, enabling wafer-scale processes to be combined with flexible substrates. This has resulted in a wealth of demonstrators in recent years. Following substantial development and optimization over many decades, thin film materials can now offer a host of advantages such as low cost and large area compatibility, and high scalability in addition to seamless heterogeneous integration.

Diodes and transistors are two of the most common active thin-film devices used in a wide range of digital and analog circuits, as well as for detection and energy generation. While they have been successfully used in flexible platforms, their performance and applicability in systems is limited by a number of factors, inevitability requiring use of exotic device architectures, consisting of highly optimized geometries combined with integration of novel materials. This has often facilitated tailoring of the electronic properties toward particular applications that demonstrate vast improvements in form factor, though typically at significant financial cost, which is unacceptable at the en masse scale. Though such "one-off" devices are of significant interest to the academic community, little has been achieved in the way of full-scale system integration. Indeed large-area simple devices, such as resistive and inductive networks, have been demonstrated. In order to achieve the goal of full-system integration in "next generation flexible systems" a paradigm shift in design and fabrication is necessary.

SUMMARY OF THE INVENTION

According to a preferred embodiment of the present invention, a method for fabricating semiconductor device is disclosed. The method includes the steps of: providing a substrate having a first region and a second region; forming a gate layer on the substrate; forming a first gate dielectric layer on the gate layer; forming a first channel layer on the first region and a second channel layer on the second region; and forming a first source/drain on the first channel layer and a second source/drain on the second channel layer.

According to another aspect of the present invention, a semiconductor device is disclosed. The semiconductor device includes: a substrate having a first region and a second region; a gate layer on the substrate; a gate dielectric layer on the gate layer; a first channel layer on the first region and a second channel layer on the second region; a first source/drain on the first channel layer; and a second source/drain on the second channel layer.

According to yet another aspect of the present invention, a semiconductor device is disclosed. The semiconductor device includes: a substrate having a first region and a second region; a gate layer on the substrate; a first gate dielectric layer on the gate layer; a first channel layer on the first region and a second channel layer on the second region; a first gate structure on the first channel layer and a second gate structure on the second channel layer; a first source/drain adjacent to the first gate structure; and a second source/drain adjacent to the second gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
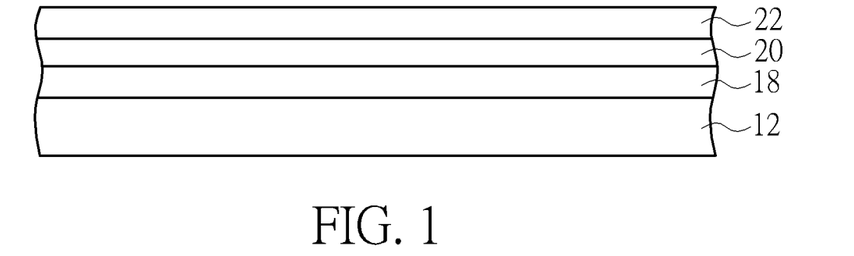
FIGS. 1-3 illustrate a method for fabricating a semiconductor device according to a first embodiment of the present invention.
Figure 2:
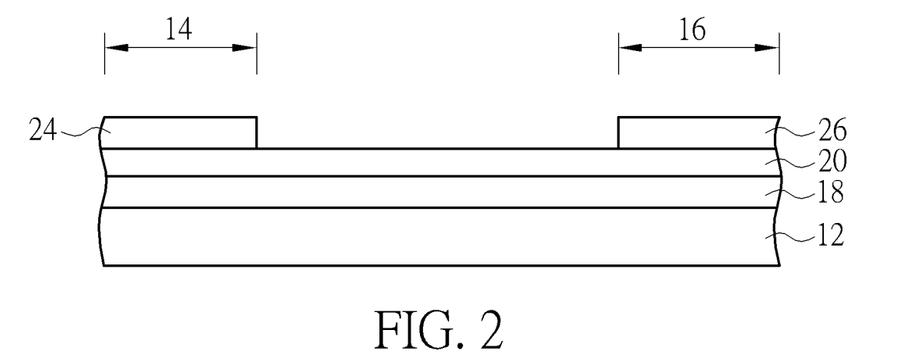
Figure 3:
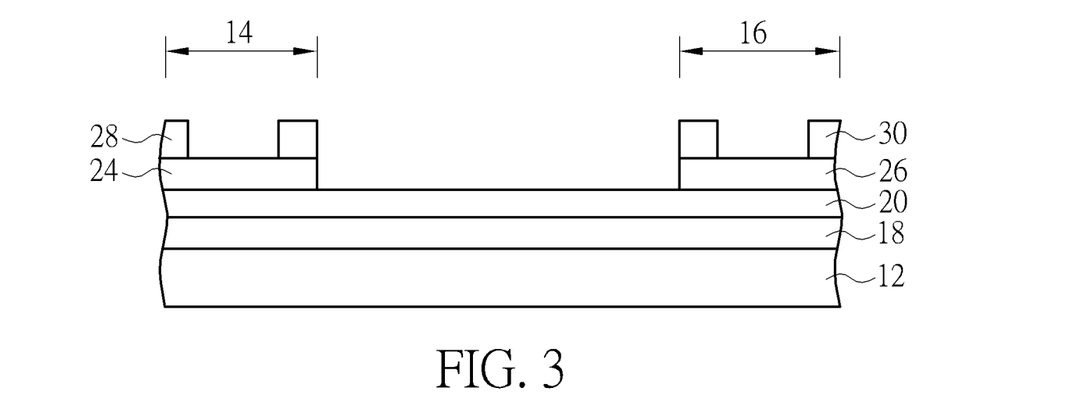

Referring to FIGS. 1-3, FIGS. 1-3 illustrate a method for fabricating a semiconductor device according to a first embodiment of the present invention. As shown in FIG. 1, a substrate 12 is provided and a first region and a second region are defined on the substrate, in which the first region is a PMOS region 14 and the second region is a NMOS region 16.

Preferably, the substrate 12 is a flexible substrate composed of flexible material, and the material of the substrate 12 is selected from the group consisting of polyimide (Kapton), polyether ether ketone (PEEK), polyethersulphone (PES), polyetherimide (PEI), polyethylene naphthalate (PEN), and polyethylene terephthalate (PET).

Next, a gate layer 18, a gate dielectric layer 20, and a channel layer 22 are sequentially deposited on the substrate 12. In this embodiment, the gate layer 18 could be composed of metal or silicon. If the gate layer 18 were to be composed of metal, the material of the gate layer 18 could be selected from the group consisting of TaN, TiN, and W. If the gate layer 18 were to be composed of silicon, the material or the gate layer 18 could be selected from the group consisting of amorphous silicon and polysilicon.

It should be noted that even though the gate layer 18 in this embodiment is a single layer composed of same material, it would also be desirable to incorporate different work function metal materials in each of the PMOS region 14 and NMOS region 16 for adjusting the threshold voltage in each region. For instance, instead of forming a single layer of gate layer 18, a work function metal layer adapted for PMOS transistor could be formed on the PMOS region 14 while another work function metal layer adapted for NMOS transistor could be formed on the NMOS region 16.

Preferably, for an NMOS transistor, a work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, a work function metal layer having a work function ranging between 4.8 eV and 5.2 eV may include titanium nitride (TiN), tantalum nitride (TaN), tantalum carbide (TaC), but it is not limited thereto.

The gate dielectric layer 20 could be composed of high-k dielectric layer or dielectric material such as $SiO_2$. If the gate dielectric 20 layer were composed of high-k dielectric layer, the high-k dielectric layer is preferably selected from dielectric materials having dielectric constant (k value) larger than 4. For instance, the high-k dielectric layer may be selected from hafnium oxide ($HfO_2$), hafnium silicon oxide (HfSiO$_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Despite the gate dielectric layer 20 is a single layered structure in this embodiment, the gate dielectric layer 20 could also be a multi-layered structure composed of combinations of high-k dielectric material and/or dielectric material having regular dielectric constant, which is also within the scope of the present invention.

The channel layer 22 is preferably composed of two-dimensional material such as phosphorene.

Next, as shown in FIG. 2, a photo-etching process is conducted by forming a patterned resist (not shown) on the channel layer 22, and an etching process is conducted to remove part of the channel layer 22 preferably between the PMOS region 14 and the NMOS region 16 and expose part of the gate dielectric layer 20 underneath. This forms a patterned channel layer 24 on the PMOS region 14 and another patterned channel layer 26 on the NMOS region 16.

A channel doping process is then conducted to implant p-type and n-type dopants into the channel layers 24, 26 on PMOS region 14 and NMOS region 16 respectively. For instance, a patterned resist (not shown) could be formed to cover the NMOS region 16, and p-type dopants are implanted into the channel layer 24 on the PMOS region 14 to form a p-type channel. After stripping the patterned resist on the NMOS region 16, another patterned resist (not shown) could be formed on the PMOS region 14, and n-type dopants are implanted into the channel layer 26 on the NMOS region 16 to form a n-type channel. An example of p-type dopants used in this embodiment includes molybdenum trioxide ($MoO_3$) and an example of n-type dopants used in this embodiment includes cesium carbonate ($Cs_2CO_3$), but not limited thereto.

Next, as shown in FIG. 3, source/drains 28, 30 are formed on the channel layers 24, 26 on PMOS region 14 and NMOS region 16 respectively. The formation of the source/drains 28, 30 could be accomplished by first forming a metal layer (not shown) on the channel layers 24, 26 and the gate dielectric layer 20, and a patterning or photo-etching process is conducted to remove part of the metal layer for forming a p-type source/drain 28 on the channel layer 24 and a n-type source/drain 30 on the channel layer 26. In this embodiment, the source/drains 28 and 30 are preferably composed of same material and examples of the source/drains 28, 30 on PMOS region 14 and NMOS region 16 are selected from the group consisting of Ti, Pd, Pt, and Au. This completes the fabrication of a semiconductor device according to a first embodiment of the present invention.

Figure 4:
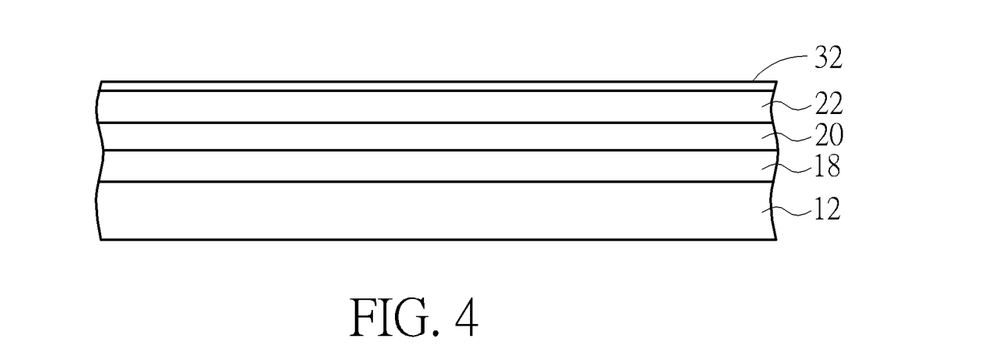
FIGS. 4-6 illustrate a method for fabricating a semiconductor device having dual gate structure according to a second embodiment of the present invention.
Figure 5:
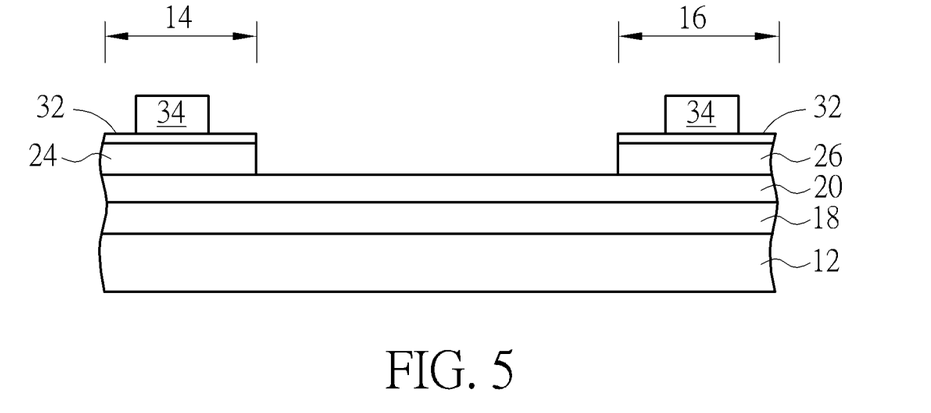
Figure 6:
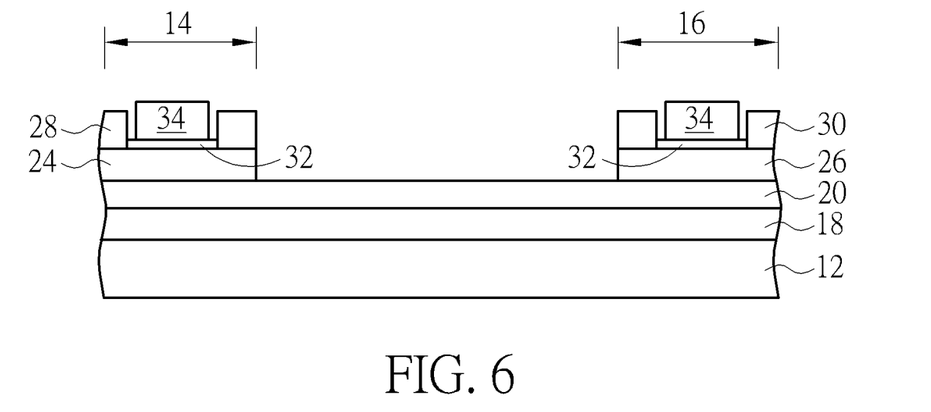

Referring to FIGS. 4-6, FIGS. 4-6 illustrate a method for fabricating a semiconductor device having dual gate structure according to a second embodiment of the present invention. As shown in FIG. 4, a structure from FIG. 1 is first provided by sequentially depositing a gate layer 18, a gate dielectric layer 20, and a channel layer 22 on a substrate 12, and another gate dielectric layer 32 is deposited on the channel layer 22 thereafter. Preferably, the gate dielectric layer 32 and the gate dielectric layer 20 could be composed of same material or different material.

In this embodiment, the gate dielectric layer 32 could be composed of high-k dielectric layer or dielectric material such as $SiO_2$. If the gate dielectric layer 32 were composed of high-k dielectric layer, the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Next, as shown in FIG. 5, a patterning or photo-etching process is conducted to remove part of the gate dielectric layer 32 and part of the channel layer 22 to form a patterned channel layer 24 on the PMOS region 14 having a patterned gate dielectric layer 32 atop and another patterned channel layer 26 on the NMOS region 16 having a patterned gate dielectric layer 32 atop.

Next, a channel doping process is then conducted to implant p-type and n-type dopants into the channel layers 24, 26 on PMOS region 14 and NMOS region 16 respectively. The channel doping process could be accomplished in the same way as disclosed in the first embodiment, and the details of which are not explained herein for the sake of brevity.

Next, another gate layer (not shown) is formed on the gate dielectric layer 32 and the gate dielectric layer 20, and a patterning or photo-etching process is conducted to remove part of the gate layer for forming a gate structure 34 on the PMOS region 14 and another gate structure 34 on the NMOS region 16. Similar to the gate layer 18, the gate structures 34 could be composed of metal or silicon. If the gate structures 34 were to be composed of metal, the material of the gate structures 34 could be selected from the group consisting of TaN, TiN, and W. If the gate structures 34 were to be composed of silicon, the material or the gate structures 34 could be selected from the group consisting of amorphous silicon and polysilicon. In this embodiment, the gate structures 34 formed above the gate dielectric layer 32 are serving as top gates while the gate layer 18 under the gate dielectric layer 20 is serving as a bottom gate, thereby constituting a dual gate structure.

It should be noted that even though the gate structures 34 on PMOS region 14 and NMOS region 16 of this embodiment share same material, it would also be desirable to incorporate different work function metal materials in each of the PMOS region 14 and NMOS region 16 for serving as top gate in each region. For instance, instead of forming a single gate layer of same material, a patterned work function metal layer adapted for PMOS transistor could be formed on the PMOS region 14 to serve as top gate and another patterned work function metal layer adapted for NMOS transistor could be formed on the NMOS region 16 to serve as another top gate, which is also within the scope of the present invention.

Preferably, for an NMOS transistor, a work function metal layer having a work function ranging between 3.9 eV and 4.3 eV may include titanium aluminide (TiAl), zirconium aluminide (ZrAl), tungsten aluminide (WAl), tantalumaluminide (TaAl), hafniumaluminide (HfAl), or titanium aluminum carbide (TiAlC), but it is not limited thereto. For a PMOS transistor, a work function metal layer having a work function ranging between 4.8 eV and 5.2 eV may include titanium nitride (TiN), tantalum nitride (TaN), tantalum carbide (TaC), but it is not limited thereto.

Next, as shown in FIG. 6, an etching process is conducted to remove part of the gate dielectric layer 32 adjacent to each of the gate structures 34 to expose the channel layers 24, 26 underneath. Next, a source/drain 28 is formed adjacent to two sides of the gate structure 34 on the channel layer 24 of PMOS region 14 and another source/drain 30 is formed adjacent two sides of the gate structure 36 on the channel layer 26 of NMOS region 16.

The formation of the source/drains 28, 30 could be accomplished by first forming a metal layer (not shown) on the channel layers 24, 26 and the gate dielectric layer 20, and a patterning or photo-etching process is conducted to remove part of the metal layer for forming a p-type source/drain 28 on the channel layer 24 and a n-type source/drain 30 on the channel layer 26. In this embodiment, the source/drains 28 and 30 are preferably composed of same material and examples of the source/drains 28, 30 are selected from the group consisting of Ti, Pd, Pt, and Au. This completes the fabrication of a semiconductor device according to a second embodiment of the present invention.

Figure 7:
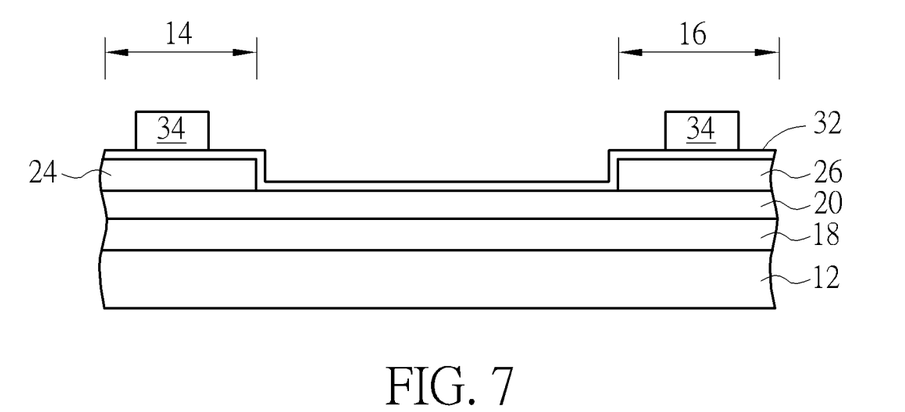
FIGS. 7-8 illustrate a method for fabricating a semiconductor device having dual gate structure according to a third embodiment of the present invention.
Figure 8:
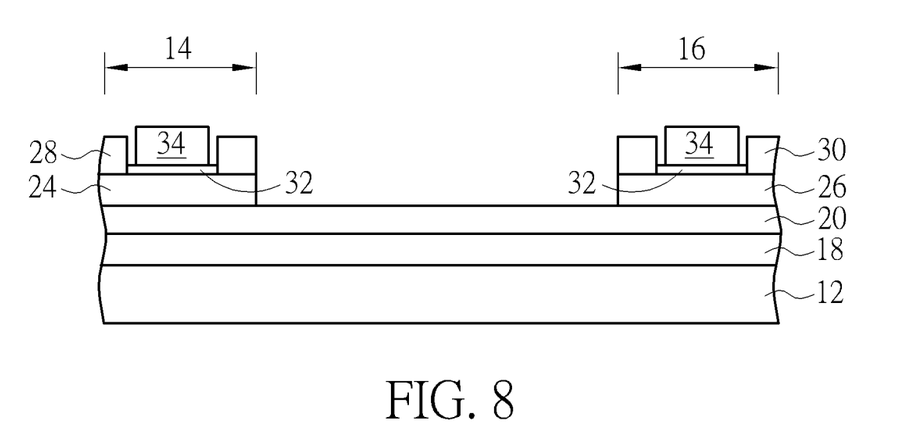

Referring to FIGS. 7-8, FIGS. 7-8 illustrate a method for fabricating a semiconductor device having dual gate structure according to a third embodiment of the present invention. As shown in FIG. 7, a structure from FIG. 2 is first provided by forming a channel layer 24 with implanted dopants on the PMOS region 14 and a channel layer 26 with implanted dopants on the NMOS region 16 respectively, and then a gate dielectric layer 32 is deposited on the channel layers 24, 26 and part of the gate dielectric layer 20. Preferably, the gate dielectric layer 32 and the gate dielectric layer 20 could be composed of same material or different material.

In this embodiment, the gate dielectric layer 32 could be composed of high-k dielectric layer or dielectric material such as $SiO_2$. If the gate dielectric layer 32 were composed of high-k dielectric layer, the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Next, another gate layer (not shown) is formed on the gate dielectric layer 32, and a patterning or photo-etching process is conducted to remove part of the gate layer for forming a gate structure 34 on the PMOS region 14 and another gate structure 34 on the NMOS region 16. Similar to the gate layer 18, the gate structures 34 could be composed of metal or silicon. If the gate structures 34 were to be composed of metal, the material of the gate structures 34 could be selected from the group consisting of TaN, TiN, and W. If the gate structures 34 were to be composed of silicon, the material or the gate structures 34 could be selected from the group consisting of amorphous silicon and polysilicon. In this embodiment, the gate structures 34 formed above the gate dielectric layer 32 are serving as top gates while the gate layer 18 under the gate dielectric layer 20 is serving as a bottom gate, thereby constituting a dual gate structure.

Similar to the second embodiment, despite the gate structures 34 on PMOS region 14 and NMOS region 16 of this embodiment share same material, it would also be desirable to incorporate different work function metal materials in each of the PMOS region 14 and NMOS region 16 for serving as top gate in each region. For instance, instead of forming a single gate layer of same material, a patterned work function metal layer adapted for PMOS transistor could be formed on the PMOS region 14 to serve as a top gate and another patterned work function metal layer adapted for NMOS transistor could be formed on the NMOS region 16 to serve as another top gate, which is also within the scope of the present invention.

Next, as shown in FIG. 8, an etching process is conducted to remove part of the gate dielectric layer 32 adjacent to each of the gate structures 34 as well as the gate dielectric layer 32 directly on the gate dielectric layer 20 and expose the channel layers 24, 26 underneath. Next, a source/drain 28 is formed adjacent to two sides of the gate structure 34 on the channel layer 24 of PMOS region 14 and another source/drain 30 is formed adjacent two sides of the gate structure 36 on the channel layer 26 of NMOS region 16.

The formation of the source/drains 28, 30 could be accomplished by first forming a metal layer (not shown) on the channel layers 24, 26 and the gate dielectric layer 20, and a patterning or photo-etching process is conducted to remove part of the metal layer for forming a p-type source/drain 28 on the channel layer 24 and a n-type source/drain 30 on the channel layer 26. In this embodiment, the source/drains 28 and 30 are preferably composed of same material and examples of the source/drains 28, 30 are selected from the group consisting of Ti, Pd, Pt, and Au. This completes the fabrication of a semiconductor device according to a third embodiment of the present invention.

Figure 9:
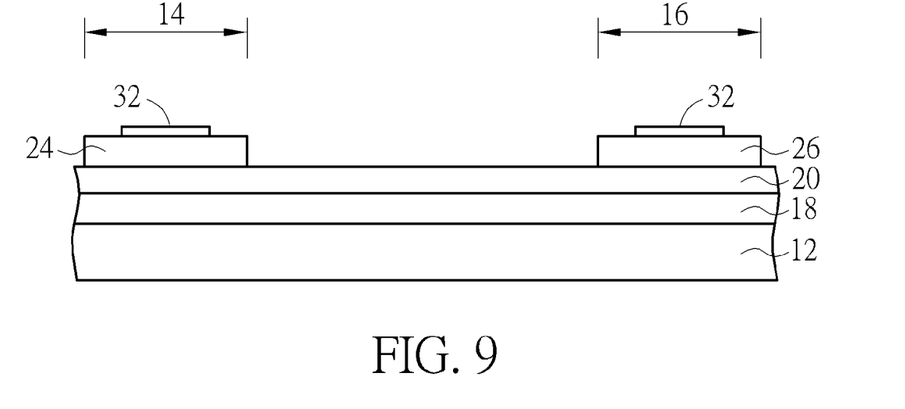
FIGS. 9-10 illustrate a method for fabricating a semiconductor device having dual gate structure according to a fourth embodiment of the present invention.
Figure 10:
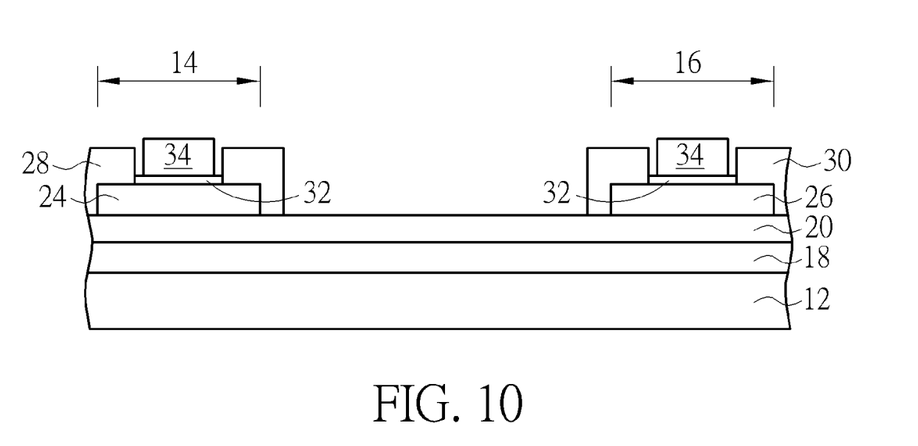

Referring to FIGS. 9-10, FIGS. 9-10 illustrate a method for fabricating a semiconductor device having dual gate structure according to a fourth embodiment of the present invention. As shown in FIG. 9, a structure from FIG. 2 is first provided by forming a channel layer 24 with implanted dopants on the PMOS region 14 and a channel layer 26 with implanted dopants on the NMOS region 16 respectively, and then a gate dielectric layer 32 is deposited on the channel layers 24, 26 and part of the gate dielectric layer 20. Preferably, the gate dielectric layer 32 and the gate dielectric layer 20 could be composed of same material or different material. Next, a patterning or photo-etching process is conducted to remove part of the gate dielectric layer 32 for exposing part of the channel layers 24, 26 underneath.

In this embodiment, the gate dielectric layer 32 could be composed of high-k dielectric layer or dielectric material such as $SiO_2$. If the gate dielectric layer 32 were composed of high-k dielectric layer, the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Next, as shown in FIG. 10, a material layer (not shown) is formed on the exposed channel layers 24, 26, patterned gate dielectric layers 32, and gate dielectric layer 20, and a patterning or photo-etching process is conducted to remove part of the material layer to form a gate structure 34 and source/drain 28 on PMOS region 14 and a gate structure 34 and source/drain 30 on NMOS region 16 at the same time. In contrast to the aforementioned embodiments of forming gate structures 34 and source/drains 28, 30 separately, the gate structures 34 and source/drains 28, 30 of this embodiment could be formed in a single step.

Also, it should be noted that the pattern of the source/drains 28, 30 could also be adjusted according to the demand of the product, and this feature is not limited to this embodiment, but could also be applied to all of the aforementioned embodiments. For instance, it would also be desirable to adjust the pattern of the source/drains 28, 30 so that the source/drains 28, 30 not only land on top of the channel layers 24, 26 but also land on the gate dielectric layer 20 while contacting the sidewalls of the channel layers 24, 26.

In this embodiment, the gate structures 34 and the source/drains 28 and 30 are preferably composed of same material, and examples of the gate structures 34 and source/drains 28, 30 are selected from the group consisting of Ti, Pd, Pt, and Au.

Overall, the present invention discloses an approach of integrating two-dimensional material such as phosphorene or black phosphorus onto a flexible substrate for creating low-power nano-electronic devices that can be applied to future applications in healthcare, automotive industry, human-machine interfaces, mobile devices, and other environments. Preferably, the formation of a nano-electronic device is accomplished by sequentially forming a gate layer, a gate dielectric layer, and a channel layer onto a flexible substrate, doping and patterning the channel layer to form a first channel layer on PMOS region and a second channel layer on NMOS region, and finally forming a source/drain on each of the first channel layer and second channel layer. In addition to the single gate design, a dual gate design is further disclosed by forming an additional gate dielectric layer and another gate structure serving as top gate on each of the first channel layer and second channel layer, and source/drains are formed adjacent to the top gates thereafter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a first region and a second region;
    forming a gate layer extending from the first region to the second region on the substrate;
    forming a first gate dielectric layer on the gate layer;
    forming a first channel layer on the first region and a second channel layer on the second region; and
    forming a first source/drain on the first channel layer and a second source/drain on the second channel layer, wherein the top surfaces of the first source/drain and the second source/drain are higher than the top surfaces of the first channel layer and the second channel layer, and an edge of the first channel layer is aligned with an edge of the first source/drain and an edge of the first gate dielectric layer.

2. The method of claim 1, further comprising:
    forming a channel layer on the first gate dielectric layer;
    patterning the channel layer to form the first channel layer and the second channel layer.

3. The method of claim 1, further comprising:
    forming a first metal layer on the first channel layer;
    patterning the first metal layer to form the first source/drain;
    forming a second metal layer on the second channel layer; and
    patterning the second metal layer to form the second source/drain.

4. The method of claim 1, wherein the substrate comprises a flexible substrate.

5. The method of claim 4, wherein the flexible substrate is selected from the group consisting of polyimide (Kapton), polyether ether ketone (PEEK), polyethersulphone (PES), polyetherimide (PEI), polyethylene naphthalate (PEN), and polyethylene terephthalate (PET).

6. The method of claim 1, wherein the first channel layer or the second channel layer comprises phosphorene.

7. The method of claim 1, wherein the first source/drain and the second source/drain are selected from the group consisting of Ti, Pd, Pt, and Au.

8. The method of claim 1, further comprising:
    forming a second gate dielectric layer on the first channel layer and a third gate dielectric layer on the second channel layer;
    forming a first gate structure on the first channel layer and a second gate structure on the second channel layer; and
    forming the first source/drain adjacent to the first gate structure and the second source/drain adjacent to the second gate structure.

9. The method of claim 8, wherein the first gate structure and the second gate structure comprise metal gates.

10. The method of claim 8, wherein the second gate dielectric layer and the third gate dielectric layer comprise high-k dielectric layers.

11. A semiconductor device, comprising:
    a substrate having a first region and a second region;
    a gate layer extending from the first region to the second region on the substrate;
    a gate dielectric layer on the gate layer;
    a first channel layer on the first region and a second channel layer on the second region;
    a first source/drain on the first channel layer, wherein a top surface of the first source/drain is higher than a top surface of the first channel layer and an edge of the first channel layer is aligned with an edge of the first source/drain and an edge of the first gate dielectric layer; and
    a second source/drain on the second channel layer, wherein a top surface of the second source/drain is higher than a top surface of the second channel layer.

12. The semiconductor device of claim 11, wherein the substrate comprises a flexible substrate.

13. The semiconductor device of claim 12, wherein the flexible substrate is selected from the group consisting of polyimide (Kapton), polyether ether ketone (PEEK), polyethersulphone (PES), polyetherimide (PEI), polyethylene naphthalate (PEN), and polyethylene terephthalate (PET).

14. The semiconductor device of claim 11, wherein the first channel layer or the second channel layer comprises phosphorene.

15. The semiconductor device of claim 11, wherein the first source/drain and the second source/drain are selected from the group consisting of Ti, Pd, Pt, and Au.

16. A semiconductor device, comprising:
a substrate having a first region and a second region;
a gate layer extending from the first region to the second region on the substrate;
a first gate dielectric layer on the gate layer;
a first channel layer on the first region and a second channel layer on the second region;
a first gate structure on the first channel layer and a second gate structure on the second channel layer;
a first source/drain adjacent to the first gate structure, wherein a top surface of the first source/drain is higher than a top surface of the first channel layer and an edge of the first channel layer is aligned with an edge of the first source/drain and an edge of the first gate dielectric layer; and
a second source/drain adjacent to the second gate structure, wherein a top surface of the second source/drain is higher than a top surface of the second channel layer.

17. The semiconductor device of claim 16, wherein the substrate comprises a flexible substrate.

18. The semiconductor device of claim 17, wherein the flexible substrate is selected from the group consisting of polyimide (Kapton), polyether ether ketone (PEEK), polyethersulphone (PES), polyetherimide (PEI), polyethylene naphthalate (PEN), and polyethylene terephthalate (PET).

19. The semiconductor device of claim 16, wherein the first channel layer or the second channel layer comprises phosphorene.

20. The semiconductor device of claim 16, wherein the first source/drain and the second source/drain are selected from the group consisting of Ti, Pd, Pt, and Au.

* * * * *